(12) United States Patent
Lee

(10) Patent No.: US 8,858,756 B2
(45) Date of Patent: Oct. 14, 2014

(54) ULTRATHIN WAFER DEBONDING SYSTEMS

(71) Applicant: Masahiro Lee, Tokai (JP)

(72) Inventor: Masahiro Lee, Tokai (JP)

(*) Notice: Subject to any disclaimer, the term of this patent is extended or adjusted under 35 U.S.C. 154(b) by 175 days.

(21) Appl. No.: 13/653,410

(22) Filed: Oct. 17, 2012

(65) Prior Publication Data
US 2013/0105090 A1    May 2, 2013

Related U.S. Application Data

(60) Provisional application No. 61/553,864, filed on Oct. 31, 2011, provisional application No. 61/591,069, filed on Jan. 26, 2012.

(51) Int. Cl.
*B32B 38/10* (2006.01)
*B32B 41/00* (2006.01)
*H01L 21/67* (2006.01)
*B32B 43/00* (2006.01)

(52) U.S. Cl.
CPC ............... *B32B 38/10* (2013.01); *B32B 41/00* (2013.01); *B32B 2310/028* (2013.01); *B32B 2457/14* (2013.01); *H01L 21/67092* (2013.01); *B32B 43/006* (2013.01); *C09J 2205/302* (2013.01)
USPC ........... 156/705; 156/711; 156/714; 156/718; 156/752; 156/754

(58) Field of Classification Search
CPC ........................ B32B 43/006; C09J 2205/302
USPC .............. 156/705, 711, 714, 718, 754, 763
See application file for complete search history.

(56) References Cited

U.S. PATENT DOCUMENTS

| 5,690,749 A | 11/1997 | Lee | |
|---|---|---|---|
| 6,068,727 A * | 5/2000 | Weaver et al. | 156/701 |
| 6,435,249 B1 * | 8/2002 | Komine et al. | 156/763 |
| 8,376,017 B2 * | 2/2013 | Lee et al. | 156/752 |
| 2011/0048641 A1 | 3/2011 | Sugimura et al. | |

* cited by examiner

*Primary Examiner* — Mark A Osele
(74) *Attorney, Agent, or Firm* — Lodestar Patents, PLLC; Raymond J. E. Hall

(57) ABSTRACT

Improved semiconductor wafer debonding system, method, and apparatus, including a stress-free means for multi-axis debonding utilizing a specialized tool or fixture having at least one ultrasonic transducer.

24 Claims, 3 Drawing Sheets

ULTRATHIN WAFER DEBONDING SYSTEMS

CROSS-REFERENCE TO RELATED APPLICATION

The present application is related to and claims priority from prior provisional application Ser. No. 61/591,069, filed Jan. 26, 2012, entitled "ULTRATHIN WAFER DEBONDING SYSTEMS"; and, this application is related to and claims priority from prior provisional application Ser. No. 61/553,864, filed Oct. 31, 2011, entitled "ULTRATHIN WAFER DEBONDING SYSTEMS"; the contents of all of which are incorporated herein by this reference and are not admitted to be prior art with respect to the present invention by the mention in this cross-reference section.

BACKGROUND

This invention relates to providing an improved silicon wafer debonding system. More particularly, this invention relates to providing new wafer debonding apparatus including stress-free means for multi-axis film debonding utilizing a specialized tool or fixture.

Thinned semiconductor wafers are relatively fragile and often require a temporary rigid support that allows the wafer to be successfully processed through a series of fabrication steps. Current handling and processing of ultrathin wafers (and similar items) includes debonding of the wafer from such a temporary support (e.g., a thin flexible film). Reliable, high-throughput debonding processes are difficult to achieve as any force applied to the wafer to promote debonding adds an increased risk of damage to the wafer. A system to assist damage-free debonding of a thin or ultra-thin silicon wafer from a support material would be of benefit to many in this field.

OBJECTS AND FEATURES OF THE INVENTION

A primary object and feature of the present invention is to provide a system overcoming the above-mentioned problem(s). It is a further object and feature of the present invention to provide such a system comprising at least one debonding tool or fixture having one or more ultrasonic transducers to facilitate (initiate) edge separation and debonding of a silicon-wafer from a supportive film or other bonded lamination. It is a further object and feature of the present invention to provide such a system utilizing at least one means for applying thermal energy to the above-noted workpiece to promote such debonding. It is another object and feature of the present invention to provide such a system providing at least one means for applying at least one computer-controlled separation force to the workpiece to assist separation of the wafer from the film.

It is a further object and feature of the present invention to provide such a system configured to apply, to at least one portion of the workpiece, at least one computer-controlled separation force including at least one computer-controlled twist-force, at least one computer-controlled tilt-force, and/or at least one computer-controlled lift-force.

Further objects and features of the present invention are to provide such a system that is efficient, inexpensive, and useful. Other objects and features of this invention will become apparent with reference to the following descriptions.

SUMMARY OF THE INVENTION

In accordance with a preferred embodiment hereof, this invention provides a system relating to debonding processes wherein at least one bonded lamination is debonded from at least one thin planar workpiece, such system comprising: at least one first interactor structured and arranged to interact with a first surface of the at least one thin planar workpiece; at least one second interactor structured and arranged to interact with a second surface of the at least one thin planar workpiece; and at least one computer controller structured and arranged to assist computer-controlled interaction, of at least one of such at least one first interactor and such at least one second interactor, with the at least one thin planar workpiece during such debonding; wherein each one of such at least one first interactor and such at least one second interactor comprises at least one positioning-force applicator configured to apply at least one positioning force assisting positioning of the at least one thin planar workpiece during such debonding; wherein at least one of such first at least one interactor and such at least one second interactor comprises at least one ultrasonic energy applicator configured to apply ultrasonic energy to at least one portion of the at least one thin planar workpiece, during such debonding, at least one thermal applicator configured to apply thermal energy to at least one portion of the at least one thin planar workpiece during such debonding, and at least one separation-force applicator configured to apply to at least one portion of the at least one thin planar workpiece at least one computer-controlled separation force assisting separation of the at least one bonded lamination from the at least one thin planar workpiece.

Moreover, it provides such a system wherein such at least one separation-force applicator is configured to apply, to at least one portion of the at least one thin planar workpiece, at least one computer-controlled lift-force assisting such debonding. Additionally, it provides such a system wherein such at least one separation-force applicator is configured to apply, to at least one portion of the at least one thin planar workpiece, at least one computer-controlled twist-force assisting such debonding. Also, it provides such a system wherein such at least one separation-force applicator is configured to apply, to at least one portion of the at least one thin planar workpiece, at least one computer-controlled tilt-force during such debonding. In addition, it provides such a system wherein such at least one separation-force applicator is configured to apply, to at least one portion of the at least one thin planar workpiece, at least one computer-controlled twist-force during such debonding process. And, it provides such a system wherein such at least one separation-force applicator is configured to apply, to at least one portion of the at least one thin planar workpiece, at least one computer-controlled tilt-force during such debonding.

Further, it provides such a system wherein such at least one separation-force applicator is configured to apply, to at least one portion of the at least one thin planar workpiece, at least one computer-controlled tilt-force during such debonding. Even further, it provides such a system wherein such at least one separation-force applicator is configured to apply, to at least one portion of the at least one thin planar workpiece, at least one computer-controlled separation force selected from the group consisting essentially of: at least one computer-controlled twist-force, at least one computer-controlled tilt-force, at least one computer-controlled lift-force. Moreover, it provides such a system wherein: such at least one thin planar workpiece comprises at least one semi-conductor material; and such at least one first interactor, such at least one second interactor, and such at least one computer controller are structured and arranged to assist computer-controlled interaction with such at least one semi-conductor material.

In accordance with another preferred embodiment hereof, this invention provides a system relating to debonding processes wherein at least one bonded lamination is debonded from at least one thin planar workpiece, such system comprising: first interactor means for interaction with a first surface of the at least one thin planar workpiece; second interactor means for interaction with a second surface of the at least one thin planar workpiece; and computer controller means for assisting computer-controlled interaction, of at least one of such first interactor means and such second interactor means, with the at least one thin planar workpiece during such debonding; wherein each one of such first interactor means and such second interactor means comprises positioning-force applicator means for applying at least one positioning force assisting positioning of the at least one thin planar workpiece during such debonding; wherein at least one of such first interactor means and such second interactor means comprises ultrasonic energy applicator means for applying ultrasonic energy to at least one portion of the at least one thin planar workpiece, during such debonding, thermal applicator means for applying thermal energy to at least one portion the at least one thin planar workpiece during such debonding, and separation-force applicator means for applying to at least one portion of the at least one thin planar workpiece at least one computer-controlled separation force assisting separation of the at least one bonded lamination from the at least one thin planar workpiece.

Additionally, it provides such a system wherein such separation-force applicator means is configured to apply, to at least one portion of the at least one thin planar workpiece, at least one computer-controlled lift-force assisting such debonding. Also, it provides such a system wherein such separation-force applicator means is configured to apply, to at least one portion of the at least one thin planar workpiece, at least one computer-controlled twist-force assisting such debonding. In addition, it provides such a system wherein such separation-force applicator means is configured to apply, to at least one portion of the at least one thin planar workpiece, at least one computer-controlled tilt-force during such debonding. And, it provides such a system wherein such separation-force applicator means is configured to apply, to at least one portion of the at least one thin planar workpiece, at least one computer-controlled twist-force during such debonding process.

Further, it provides such a system wherein such separation-force applicator means is configured to apply, to at least one portion of the at least one thin planar workpiece, at least one computer-controlled tilt-force during such debonding. Even further, it provides such a system wherein such separation-force applicator means is configured to apply, to at least one portion of the at least one thin planar workpiece, at least one computer-controlled twist-force during such debonding. Even further, it provides such a system wherein such separation-force applicator means is configured to apply, to at least one portion of the at least one thin planar workpiece, at least one computer-controlled separation force selected from the group consisting essentially of: at least one computer-controlled twist-force, at least one computer-controlled tilt-force, at least one computer-controlled lift-force.

In accordance with another preferred embodiment hereof, this invention provides a method relating to debonding processes wherein at least one bonded lamination is debonded from at least one thin planar workpiece, such system comprising: providing at least one first interactor structured and arranged to interact with a first surface of the at least one thin planar workpiece; providing at least one second interactor structured and arranged to interact with a second surface of the at least one thin planar workpiece; providing at least one computer controller structured and arranged to assist computer-controlled interaction, of at least one of such at least one first interactor and such at least one second interactor, with the at least one thin planar workpiece during such debonding; structuring and arranging each one of such at least one first interactor and such at least one second interactor to comprise at least one positioning-force applicator configured to apply at least one positioning force assisting positioning of the at least one thin planar workpiece during such debonding; structuring and arranging at least one of such first at least one interactor and such at least one second interactor to comprise at least one ultrasonic energy applicator configured to apply ultrasonic energy to at least one portion of the at least one thin planar workpiece, during such debonding, at least one thermal applicator configured to apply thermal energy to at least one portion of the at least one thin planar workpiece during such debonding, and at least one separation-force applicator configured to apply to at least one portion of the at least one thin planar workpiece at least one computer-controlled separation force assisting separation of the at least one bonded lamination from the at least one thin planar workpiece.

Even further, it provides such a method further comprising the step of applying to the at least one thin planar workpiece at least one computer-controlled lift-force by such at least one separation-force applicator to assist such debonding. Even further, it provides such a method further comprising the step of applying to the at least one thin planar workpiece at least one computer-controlled twist-force by such at least one separation-force applicator to assist such debonding. Even further, it provides such a method further comprising the step of applying to the at least one thin planar workpiece at least one computer-controlled tilt-force by such at least one separation-force applicator to assist such debonding. Furthermore, it provides such a method further comprising the step of applying to the at least one thin planar workpiece at least one computer-controlled twist-force by such at least one separation-force applicator to assist such debonding. Even further, it provides such a method further comprising the step of applying to the at least one thin planar workpiece at least one computer-controlled tilt-force by such at least one separation-force applicator to assist such debonding. Even further, it provides such a system wherein such separation-force applicator means is configured to apply, to at least one portion of the at least one thin planar workpiece, at least one computer-controlled twist-force during such debonding.

In accordance with preferred embodiments hereof, this invention provides each and every novel feature, element, combination, step and/or method disclosed or suggested by this patent application.

BRIEF DESCRIPTION OF THE ATTACHMENT

DETAILED DESCRIPTION OF THE BEST MODES AND PREFERRED EMBODIMENTS OF THE INVENTION

Figure 1:
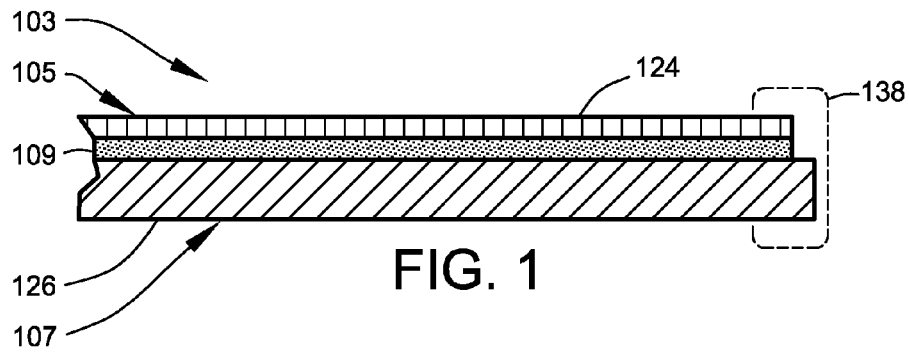
FIG. 1 shows a schematic sectional diagram illustrating a thin planar workpiece comprising a thin or ultra-thin silicon wafer bonded to a supportive film according to representative workpieces processed by preferred embodiments of the present invention.

FIG. 1 shows a schematic sectional diagram illustrating a thin or ultra-thin semiconductor wafer 105 bonded to a supportive lamination 107 according to a representative thin planar workpiece 103 that may be debonded by preferred embodiments of the present invention. Semiconductor wafer 105 may preferably comprise a silicon wafer in the thickness range of less than about 200 Micrometers (μm). Semiconductor wafer 105 may preferably comprise thinned silicon wafers having thicknesses considerably less than 200 μm. The supportive lamination 107 may comprises an industry-standard support film or tape. Supportive lamination 107 preferably is adhesive bonded to silicon wafer 105 by an adhesive layer 109, as shown. Commercially-available adhesives compatible with the system include those utilizing thermal debonding release mechanisms.

One process flow for temporary bonding involves adhesive bonding of the supportive lamination 107 to semiconductor wafer 105 followed by surface processing (thinning, etching, etc.). On completion of the above-noted processing step(s), the thin semiconductor wafer 105 preferably is then debonded from supportive lamination 107. Extreme care is needed during the debonding process in order to avoid fracture, surface damage, or warping of the extremely thin wafers.

Figure 2:
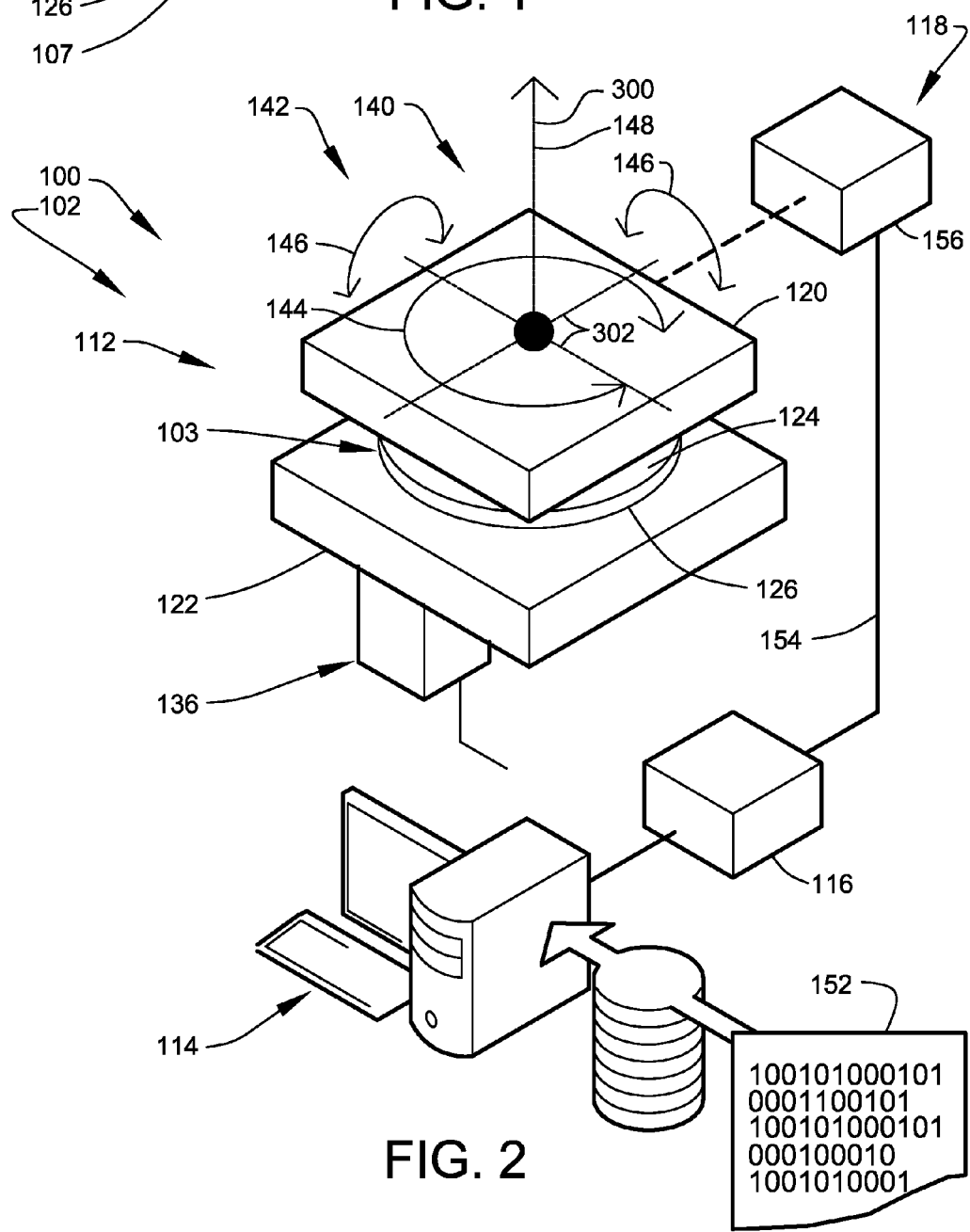
FIG. 2 shows a schematic diagram generally illustrating a computer-controlled debonding tool according to a preferred embodiment of the present invention.
Figure 3:
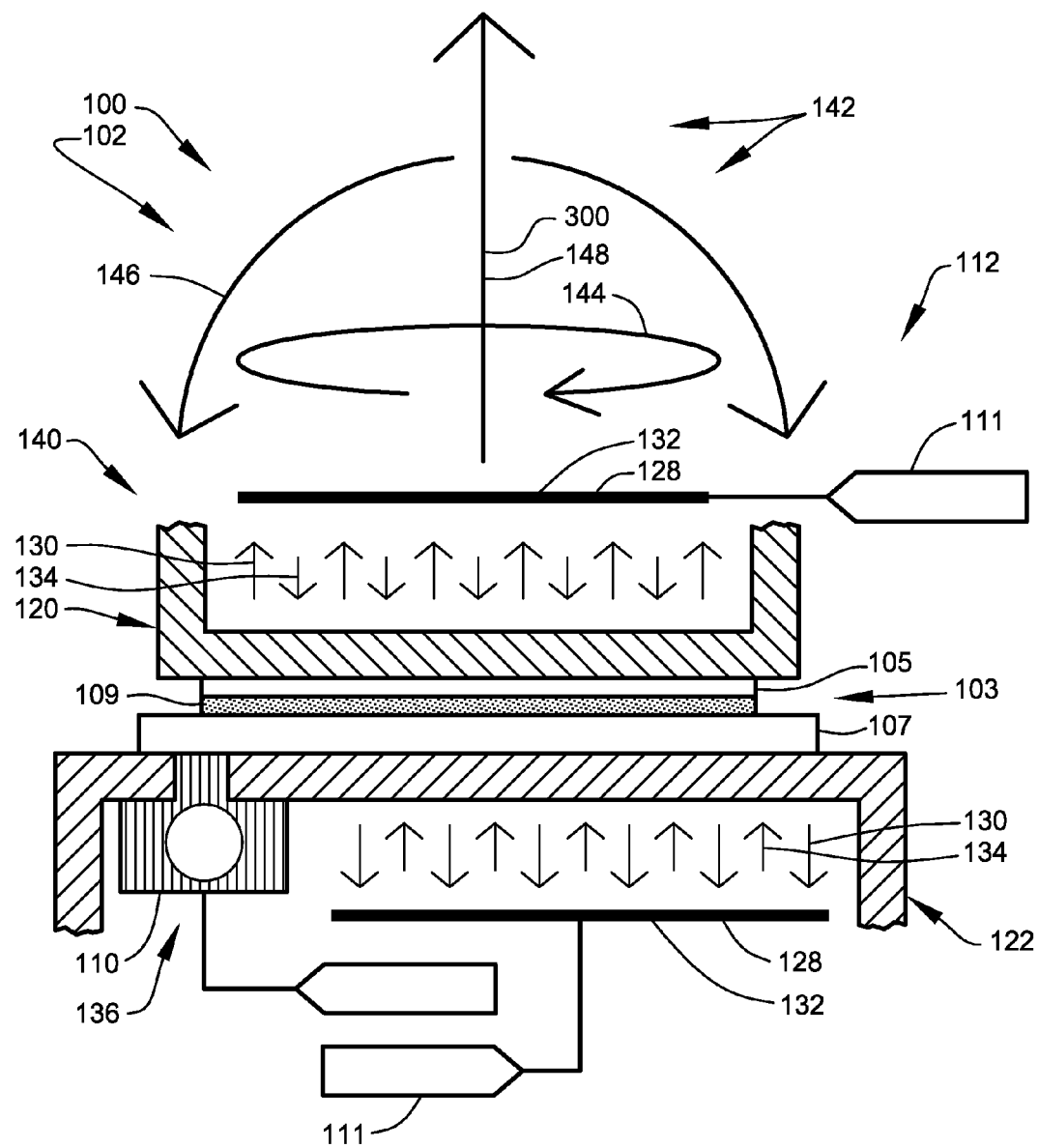
FIG. 3 shows a schematic sectional diagram illustrating the thin planar workpiece of FIG. 1 engaged within the computer-controlled debonding tool, according to the preferred embodiment of FIG. 2.

FIG. 2 shows a schematic diagram generally illustrating a computer-controlled debonding tool 102 according to a preferred embodiment of silicon wafer debonding system 100. FIG. 3 shows a schematic sectional diagram illustrating the thin planar workpiece 103 of FIG. 1 engaged within computer-controlled debonding tool 102, according to the preferred embodiment of FIG. 2.

Referring to the illustrations of the present disclosure, silicon wafer debonding system 100 preferably provides a set of fixtures/tools for stress-less debonding of the thin silicon wafer 105 from the supportive lamination 107. The preferred system embodiments utilize one or more ultrasonic energy applicators 136 that are preferably mounted within a computer-controlled debonding fixture 112, as shown. The computer-controlled debonding fixture 112 is further configured to interact with the workpiece by applying thermal energy 134 (heat) and at least one computer-controlled separation force designed to further assist such stress-less debonding of the thin silicon wafer 105 from the supportive lamination 107.

FIG. 2 diagrammatically illustrates a generalized preferred embodiment of silicon wafer debonding system 100. Computer-controlled debonding tool 102 preferably comprises computer-controlled debonding fixture 112 and at least one control computer 114 communicating with at least one hardware controller 116 and tool actuator subsystem 118, as shown.

Computer-controlled debonding fixture 112 preferably comprises a first (upper) vacuum chuck 120 and second (lower) vacuum chuck 122, as shown. First vacuum chuck 120 is preferably structured and arranged to interact with a first surface 124 of thin planar workpiece 103 (at least embodying herein first interactor means for interaction with a first surface of the at least one thin planar workpiece and a first interactor structured and arranged to interact with a first surface of the at least one thin planar workpiece). Second vacuum chuck 122 is preferably structured and arranged to interact with a second surface 126 of thin planar workpiece 103 (at least embodying herein second interactor means for interaction with a second surface of the at least one thin planar workpiece and a second interactor structured and arranged to interact with a second surface of the at least one thin planar workpiece).

Preferably, first vacuum chuck 120 and second vacuum chuck 122 each comprises at least one positioning-force applicator 128 preferably configured to apply at least one negative-pressure (vacuum) force 130 assisting positioning of thin planar workpiece 103 during such debonding process (at least embodying herein wherein each one of such first interactor means and such second interactor means comprises positioning-force applicator means for applying at least one positioning force assisting positioning of the at least one thin planar workpiece during such debonding). Each chuck is preferably configured to comprise one or more vacuum feed passages extending through the chuck body. Each vacuum chuck is preferably coupled to at least one negative-pressure source 111.

Preferably, at least one of first vacuum chuck 120 and second vacuum chuck 122 comprises at least one thermal applicator 132 configured to apply thermal energy 134 to at least one portion of one thin planar workpiece 103 during such debonding process. More preferably, both first vacuum chuck 120 and second vacuum chuck 122 comprise a thermal applicator 132 and are preferably arranged to heat the adhesive in essentially the entire adhesive layer 109 (at least embodying herein thermal applicator means for applying thermal heat energy to at least one portion the at least one thin planar workpiece during such debonding and at least one thermal applicator configured to apply thermal energy to at least one portion of the at least one thin planar workpiece during such debonding).

To further assist debonding, at least one of first vacuum chuck 120 and second vacuum chuck 122 preferably comprises at least one ultrasonic energy applicator 136 configured to apply ultrasonic energy to at least one portion of thin planar workpiece 103 (at least embodying herein ultrasonic energy applicator means for applying ultrasonic energy to at least one portion of the at least one thin planar workpiece, during such debonding). Preferably, ultrasonic energy applicator 136 comprises one or more ultrasonic multi-wave transducers/generators 110. The output of the ultrasonic multi-wave transducer/generator 110 is preferably focused at an edge portion 138 of thin planar workpiece 103 (see FIG. 1) to help initiate a "cracking off" (peeling effect) of semiconductor wafer 105 from the substrate material/carrier.

The debonding process preferably begins with the engaging of thin planar workpiece 103 within first vacuum chuck 120 and second vacuum chuck 122. Heat energy is preferably applied to the workpiece, by thermal applicator 132, and ultrasonic radiation is applied by ultrasonic energy applicator 136. This assists the decomposition of adhesive layer 109, thus promoting delamination of the wafer and the substrate material/carrier. This low-stress debonding is highly preferred in order to avoid fracture, surface damage, or warping of the extremely thin wafers.

Preferably, at least one of first vacuum chuck 120 and second vacuum chuck 122 are configured to apply least one separation-force to at least one portion of thin planar workpiece 103. More specifically, at least one of first vacuum chuck 120 and second vacuum chuck 122 is configured to function as a separation-force applicator 140 to apply at least one computer-controlled separation force 142 assisting separation of semiconductor wafer 105 from supportive lamination 107.

In the present preferred embodiment, first vacuum chuck 120 is operably coupled with actuator subsystem 118 is configured to function as a separation-force applicator 140 (at least embodying herein separation-force applicator means for applying to at least one portion of the at least one thin planar workpiece at least one computer-controlled separation force assisting separation of the at least one bonded lamination from the at least one thin planar workpiece). First vacuum chuck 120 is preferably configured to apply, to at least one portion of thin planar workpiece 103, at least one of three computer-controlled separation forces 142. First vacuum chuck 120 is preferably configured to apply these computer-controlled separation forces 142 in an omni-directional manner at least consisting of at least one computer-controlled twist-force 144, at least one computer-controlled tilt-force 146, and at least one computer-controlled lift-force 148, as shown. Computer-controlled twist-force 144 preferably comprises the application of a torque force about a vertical axis 300 (oriented generally perpendicular to the planar surface of thin planar workpiece 103). Computer-controlled tilt-force 146 preferably comprises the application of a torque force about a generally horizontal axis 302 (or other generally horizontal relative to the planar surface of thin planar workpiece 103). Computer-controlled lift-force 148 preferably comprises the application of an upward axial force generally parallel to vertical axis (that is, generally normal to the planar surface of thin planar workpiece 103). Control computer 114 may be programmed to apply the above-noted separation forces singly, in combination, or in programmed sequence.

Through actuator subsystem 118, control computer 114 (at least embodying herein computer controller means for assisting computer-controlled interaction, of at least one of such first interactor means and such second interactor means, with the at least one thin planar workpiece during such debonding) assists the above-described computer-controlled interaction of at least one of first vacuum chuck 120 and second vacuum chuck 122 with thin planar workpiece 103 during the debonding process. Application of computer-controlled separation forces 142 is preferably implemented using control computer 114 communicating with at least one hardware controller 116, as shown. Preferably, control computer 114 is structured and arranged to enable the operation of at least one force-control program 152, as shown. Force control program 152 preferably interoperates with hardware controller 116 to enable the application of computer-controlled separation forces 142. Preferably, any data acquisition or feedback required is handled by a data interface within control computer 114, or alternately preferably, through an appropriately enabled interface module of hardware controller 116. Preferably, control (along with any data acquisition) preferably occurs via a series of signal links 154. Preferably, control computer 114 further comprises user-interface devices of the sort well known in the art.

Hardware controller 116 preferably provides the primary hardware interface between control computer 114 and force-actuation hardware 156 of computer-controlled debonding fixture 112. Force-actuation hardware 156 may preferably comprise mechanical drives or similar mechanical actuators configured to induce controlled motion of first vacuum chuck 120. Upon reading the teachings of this specification, those of ordinary skill in the art will now understand that, under appropriate circumstances, considering such issues as intended use, advances in computer-control technology, etc., other control arrangements, such as utilizing a single (unified) controller-enabled computer embedded processors, etc., may suffice. Hardware controller 116 preferably comprises a sufficient number of control channels and data-acquisition channels to match the control and monitoring requirements of computer-controlled debonding fixture 112, as described above.

Figure 4:
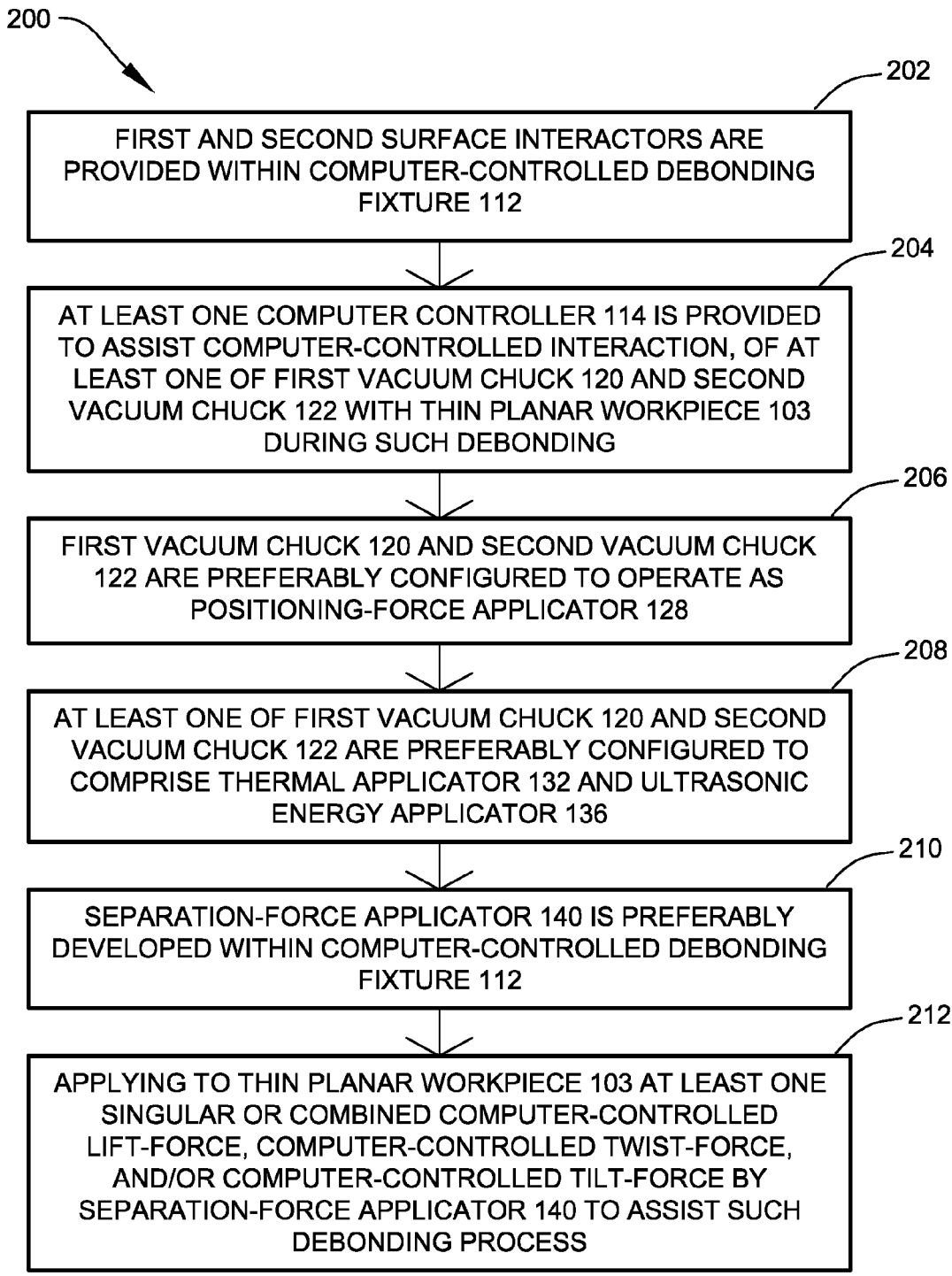
FIG. 4 is a flow diagram illustrating preferred steps in implementing a method of the present invention.

FIG. 4 is a flow diagram illustrating preferred steps in implementing method 200 of the present invention. The above-noted apparatus of silicon wafer debonding system 100 preferably enable the implementation of method 200 relating to debonding processes wherein a bonded lamination is debonded from thin planar workpiece 103. In this regard, method 200 comprises the following preferred steps. First, as indicated in preferred step 202, first and second surface interactors are provided within computer-controlled debonding fixture 112 in the form of first vacuum chuck 120 and second vacuum chuck 122. Next, at least one computer controller 114 is provided to assist computer-controlled interaction, of at least one of first vacuum chuck 120 and second vacuum chuck 122 with thin planar workpiece 103 during such debonding, as indicated in preferred step 204. Next, as indicated in preferred step 206, first vacuum chuck 120 and second vacuum chuck 122 are preferably configured to operate as positioning-force applicator 128. Next, as indicated in preferred step 208, at least one of first vacuum chuck 120 and second vacuum chuck 122 are preferably configured to comprise thermal applicator 132 and ultrasonic energy applicator 136. Next, as indicated in preferred step 210, separation-force applicator 140 is preferably developed within computer-controlled debonding fixture 112. The next series of steps preferably comprise step 212 of applying to thin planar workpiece 103 at least one singular or combined computer-controlled lift-force, computer-controlled twist-force, and/or computer-controlled tilt-force by separation-force applicator 140 to assist such debonding process.

Although applicant has described applicant's preferred embodiments of this invention, it will be understood that the broadest scope of this invention includes modifications such as diverse shapes, sizes, and materials. Such scope is limited only by the below claims as read in connection with the above specification. Further, many other advantages of applicant's invention will be apparent to those skilled in the art from the above descriptions and the below claims.

What is claimed is:

1. A system relating to debonding processes wherein at least one bonded lamination is debonded from at least one thin planar workpiece, such system comprising:
    a) at least one first interactor structured and arranged to interact with a first surface of the at least one thin planar workpiece;
    b) at least one second interactor structured and arranged to interact with a second surface of the at least one thin planar workpiece; and
    c) at least one computer controller structured and arranged to assist computer-controlled interaction, of at least one of said at least one first interactor and said at least one second interactor, with the at least one thin planar workpiece during such debonding;
    d) wherein each one of said at least one first interactor and said at least one second interactor comprises at least one positioning-force applicator configured to apply at least one positioning force assisting positioning of the at least one thin planar workpiece during such debonding; and
    e) wherein at least one of said first at least one interactor and said at least one second interactor comprises
        i) at least one ultrasonic energy applicator configured to apply ultrasonic energy to at least one portion of the at least one thin planar workpiece, during such debonding,
        ii) at least one thermal applicator configured to apply thermal energy to at least one portion of the at least one thin planar workpiece during such debonding, and iii) at least one separation-force applicator configured to apply to at least one portion of the at least one thin planar workpiece at least one computer-controlled separation force assisting separation of the at least one bonded lamination from the at least one thin planar workpiece.

2. The system, according to claim 1, wherein said at least one separation-force applicator is configured to apply, to at least one portion of the at least one thin planar workpiece, at least one computer-controlled lift-force assisting such debonding.

3. The system, according to claim 1, wherein said at least one separation-force applicator is configured to apply, to at least one portion of the at least one thin planar workpiece, at least one computer-controlled twist-force assisting such debonding.

4. The system according to claim 1 wherein said at least one separation-force applicator is configured to apply, to at least one portion of the at least one thin planar workpiece, at least one computer-controlled tilt-force during such debonding.

5. The system, according to claim 2, wherein said at least one separation-force applicator is configured to apply, to at least one portion of the at least one thin planar workpiece, at least one computer-controlled twist-force during such debonding.

6. The system, according to claim 2, wherein said at least one separation-force applicator is configured to apply, to at least one portion of the at least one thin planar workpiece, at least one computer-controlled tilt-force during such debonding.

7. The system, according to claim 5, wherein said at least one separation-force applicator is configured to apply, to at least one portion of the at least one thin planar workpiece, at least one computer-controlled tilt-force during such debonding.

8. The system, according to claim 1, wherein said at least one separation-force applicator is configured to apply, to at least one portion of the at least one thin planar workpiece, at least one computer-controlled separation force selected from the group consisting essentially of:
   a) at least one computer-controlled twist-force,
   b) at least one computer-controlled tilt-force,
   c) at least one computer-controlled lift-force.

9. The system, according to claim 1, wherein:
   a) such at least one thin planar workpiece comprises at least one semi-conductor material; and
   b) said at least one first interactor, said at least one second interactor, and said at least one computer controller are structured and arranged to assist computer-controlled interaction with such at least one semi-conductor material.

10. A system relating to debonding processes wherein at least one bonded lamination is debonded from at least one thin planar workpiece, such system comprising:
   a) first interactor means for interaction with a first surface of the at least one thin planar workpiece;
   b) second interactor means for interaction with a second surface of the at least one thin planar workpiece; and
   c) computer controller means for assisting computer-controlled interaction, of at least one of said first interactor means and said second interactor means, with the at least one thin planar workpiece during such debonding;
   d) wherein each one of said first interactor means and said second interactor means comprises positioning-force applicator means for applying at least one positioning force assisting positioning of the at least one thin planar workpiece during such debonding; and
   e) wherein at least one of said first interactor means and said second interactor means comprises
      i) ultrasonic energy applicator means for applying ultrasonic energy to at least one portion of the at least one thin planar workpiece, during such debonding,
      ii) thermal applicator means for applying thermal energy to at least one portion the at least one thin planar workpiece during such debonding, and
      iii) separation-force applicator means for applying to at least one portion of the at least one thin planar workpiece at least one computer-controlled separation force assisting separation of the at least one bonded lamination from the at least one thin planar workpiece.

11. The system, according to claim 10, wherein said separation-force applicator means is configured to apply, to at least one portion of the at least one thin planar workpiece, at least one computer-controlled lift-force assisting such debonding.

12. The system, according to claim 10, wherein said separation-force applicator means is configured to apply, to at least one portion of the at least one thin planar workpiece, at least one computer-controlled twist-force assisting such debonding.

13. The system, according to claim 10, wherein said separation-force applicator means is configured to apply, to at least one portion of the at least one thin planar workpiece, at least one computer-controlled tilt-force during such debonding.

14. The system, according to claim 11, wherein said separation-force applicator means is configured to apply, to at least one portion of the at least one thin planar workpiece, at least one computer-controlled twist-force during such debonding.

15. The system, according to claim 11, wherein said separation-force applicator means is configured to apply, to at least one portion of the at least one thin planar workpiece, at least one computer-controlled tilt-force during such debonding.

16. The system, according to claim 15, wherein said separation-force applicator means is configured to apply, to at least one portion of the at least one thin planar workpiece, at least one computer-controlled twist-force during such debonding.

17. The system according to claim 10 wherein said separation-force applicator means is configured to apply, to at least one portion of the at least one thin planar workpiece, at least one computer-controlled separation force selected from the group consisting essentially of:
   a) at least one computer-controlled twist-force,
   b) at least one computer-controlled tilt-force,
   c) at least one computer-controlled lift-force.

18. A method relating to debonding processes wherein at least one bonded lamination is debonded from at least one thin planar workpiece, such system comprising:
   a) providing at least one first interactor structured and arranged to interact with a first surface of the at least one thin planar workpiece;
   b) providing at least one second interactor structured and arranged to interact with a second surface of the at least one thin planar workpiece;
   c) providing at least one computer controller structured and arranged to assist computer-controlled interaction, of at least one of said at least one first interactor and said at least one second interactor, with the at least one thin planar workpiece during such debonding;

d) structuring and arranging each one of such at least one first interactor and said at least one second interactor to comprise at least one positioning-force applicator configured to apply at least one positioning force assisting positioning of the at least one thin planar workpiece during such debonding;
e) structuring and arranging at least one of such first at least one interactor and such at least one second interactor to comprise
   i) at least one ultrasonic energy applicator configured to apply ultrasonic energy to at least one portion of the at least one thin planar workpiece, during such debonding,
   ii) at least one thermal applicator configured to apply thermal energy to at least one portion of the at least one thin planar workpiece during such debonding, and
   iii) at least one separation-force applicator configured to apply to at least one portion of the at least one thin planar workpiece at least one computer-controlled separation force assisting separation of the at least one bonded lamination from the at least one thin planar workpiece.

19. The method, according to claim 18, further comprising the step of applying to the at least one thin planar workpiece at least one computer-controlled lift-force by such at least one separation-force applicator to assist such debonding.

20. The method, according to claim 18, further comprising the step of applying to the at least one thin planar workpiece at least one computer-controlled twist-force by such at least one separation-force applicator to assist such debonding.

21. The method, according to claim 18, further comprising the step of applying to the at least one thin planar workpiece at least one computer-controlled tilt-force by such at least one separation-force applicator to assist such debonding.

22. The method, according to claim 19, further comprising the step of applying to the at least one thin planar workpiece at least one computer-controlled twist-force by such at least one separation-force applicator to assist such debonding.

23. The method, according to claim 19, further comprising the step of applying to the at least one thin planar workpiece at least one computer-controlled tilt-force by such at least one separation-force applicator to assist such debonding.

24. The system, according to claim 23 wherein said separation-force applicator means is configured to apply, to at least one portion of the at least one thin planar workpiece, at least one computer-controlled twist-force during such debonding.

* * * * *